(12) United States Patent
Yang

(10) Patent No.: US 11,508,691 B2
(45) Date of Patent: Nov. 22, 2022

(54) SEMICONDUCTOR STRUCTURE WITH NANO-TWINNED METAL COATING LAYER AND FABRICATION METHOD THEREOF

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/200,931

(22) Filed: Mar. 15, 2021

(65) Prior Publication Data

US 2022/0271001 A1 Aug. 25, 2022

(30) Foreign Application Priority Data

Feb. 22, 2021 (CN) .......................... 202110198026.1

(51) Int. Cl.
*H01L 23/00* (2006.01)

(52) U.S. Cl.
CPC .............. *H01L 24/81* (2013.01); *H01L 24/16* (2013.01); *H01L 2224/05647* (2013.01); *H01L 2224/16227* (2013.01)

(58) Field of Classification Search
CPC ...................... H01L 24/81; H01L 24/16; H01L 2224/05647; H01L 2224/16227
See application file for complete search history.

(56) References Cited

U.S. PATENT DOCUMENTS

| | | | |
|---|---|---|---|
| 8,021,921 B2 | 9/2011 | Lin | |
| 8,592,995 B2 | 11/2013 | Lin | |
| 9,773,741 B1* | 9/2017 | Gu | ........................ H01L 21/2007 |
| 2013/0302646 A1* | 11/2013 | Chen | ....................... H01L 24/81 29/879 |
| 2014/0090880 A1* | 4/2014 | Chen | ........................ H05K 1/09 174/257 |
| 2014/0175614 A1 | 6/2014 | Wang | |
| 2014/0217593 A1 | 8/2014 | Chen | |

(Continued)

FOREIGN PATENT DOCUMENTS

| | | |
|---|---|---|
| CN | 105633038 | 4/2018 |
| CN | 110707069 | 1/2020 |

(Continued)

OTHER PUBLICATIONS

Chih Chen et al., Low-Temperature and Low-Pressure Direct Copper-to-Copper Bonding By Highly (111)-Oriented Nanotwinned Cu, 2016, pp. 1-5, XP032878283.

(Continued)

*Primary Examiner* — Douglas W Owens
(74) *Attorney, Agent, or Firm* — Winston Hsu

(57) ABSTRACT

A semiconductor structure includes a first substrate including a first contact structure located on a first pad, and a second substrate including a second contact structure on a second pad. The first contact structure includes a first metal base layer covered by a first nano-twinned metal coating layer. The second contact structure includes a second nano-twinned metal coating layer on the second pad. The first contact structure is connected to the second contact structure, thereby forming a bonding interface between the first nano-twinned metal coating layer and the second nano-twinned metal coating layer.

20 Claims, 14 Drawing Sheets

(56) References Cited

U.S. PATENT DOCUMENTS

| | | |
|---|---|---|
| 2015/0061115 A1 | 3/2015 | Chen |
| 2017/0092631 A1 | 3/2017 | Standing |
| 2019/0096845 A1 | 3/2019 | Wang |
| 2019/0252345 A1* | 8/2019 | Lin .................. H01L 27/14634 |
| 2020/0075534 A1 | 3/2020 | Gao |
| 2021/0020599 A1 | 1/2021 | Chen |

FOREIGN PATENT DOCUMENTS

| | | |
|---|---|---|
| TW | 201415563 | 4/2014 |
| TW | I476878 | 3/2015 |
| WO | 2020/046677 | 3/2020 |

OTHER PUBLICATIONS

Iuliana Panchenko et al., Effects of isothermal storage on grain structure of Cu/Sn/Cu microbump interconnects for 3D stacking, Microelectronics Reliability 102 (2019) 113296, Aug. 2, 2019, pp. 1-9, Elsevier Ltd., XP085897240.

\* cited by examiner

SEMICONDUCTOR STRUCTURE WITH NANO-TWINNED METAL COATING LAYER AND FABRICATION METHOD THEREOF

BACKGROUND OF THE INVENTION

1. Field of the Invention

The present invention relates to the field of semiconductor technology, in particular to a direct-bonding semiconductor structure with nano-twinned metal.

2. Description of the Prior Art

In modern semiconductor devices, the ever increasing device density and decreasing device dimensions demand more stringent requirements in the packaging or interconnecting techniques of such devices.

As the size of microbumps continues to shrink, the amount of solder decreases gradually, resulting the brittleness of solder joints due to formation of intermetallic compounds. Therefore, the quality of interconnect of semiconductor package is also affected. Low-temperature Cu-to-Cu direct bonding appears to be one of the solutions for fine-pitch microbumps for 3D IC packaging.

SUMMARY OF THE INVENTION

It is one object of the present invention to provide a direct-bonding semiconductor structure with a large range of nano-twin metal contact area, which can solve the shortcomings or deficiencies of the prior art.

According to one aspect of the invention, a semiconductor structure includes a first substrate having thereon a first contact structure on a first pad and a second substrate comprising a second contact structure on a second pad. The first contact structure comprises a first metal base layer covered by a first nano-twinned metal coating layer. The second contact structure comprises a second nano-twinned metal coating layer on the second pad. The first contact structure is connected with the second contact structure, thereby constituting a bonding interface directly between the first nano-twinned metal coating layer and the second nano-twinned metal coating layer.

According to some embodiments, the first metal base layer protrudes from a top surface of the first pad, and wherein the first nano-twinned metal coating layer covers a top surface and a sidewall of the first metal base layer and extends to the top surface of the first pad around the first metal base layer.

According to some embodiments, the second contact structure comprises a contact hole in a dielectric layer and wherein the second nano-twinned metal coating layer is coated on a sidewall of the contact hole and on a top surface of the second pad.

According to some embodiments, the first nano-twinned metal coating layer on the top surface of the first pad around the metal base layer is in direct contact with the second nano-twinned metal coating layer on the sidewall of the contact hole.

According to some embodiments, the first contact structure comprises a first portion and a second portion, wherein only the first portion is connected with the second contact structure, thereby forming a gap between the first substrate and the second substrate.

According to some embodiments, the second portion is surrounded by a bond enhancement layer.

According to some embodiments, the bond enhancement layer comprises Ni, Cu, Sn, Au, Ag, In, Pt or Co.

According to some embodiments, the gap is filled with a sealant.

According to some embodiments, the first nano-twinned metal coating layer is a first nano-twinned copper coating layer, and the second nano-twinned metal coating layer is a second nano-twinned copper coating layer.

According to some embodiments, the first nano-twinned copper coating layer and the second nano-twinned copper coating layer are (111)—oriented nano-twinned copper coating layers.

According to some embodiments, the second contact structure comprises a second metal base layer covered by the second nano-twinned metal coating layer.

According to some embodiments, the second metal base layer protrudes from a top surface of the second pad, and wherein the second nano-twinned metal coating layer covers a top surface and a sidewall of the second metal base layer and extends to the top surface of the second pad around the second metal base layer.

According to some embodiments, the first contact structure and the second contact structure are surrounded by a bond enhancement layer.

According to some embodiments, the bond enhancement layer comprises Ni, Cu, Sn, Au, Ag, In, Pt or Co.

According to some embodiments, a gap between the first substrate and the second substrate is filled with a sealant.

According to another aspect of the invention, a method for forming a semiconductor structure is disclosed. A first substrate having thereon a first contact structure on a first pad is provided. The first contact structure comprises a first metal base layer covered by a first nano-twinned metal coating layer. A second substrate comprising a second contact structure on a second pad is provided. The second contact structure comprises a second nano-twinned metal coating layer on the second pad. The second substrate is bonded to the first substrate by engaging the first contact structure with the second contact structure, thereby constituting a bonding interface directly between the first nano-twinned metal coating layer and the second nano-twinned metal coating layer.

According to still another aspect of the invention, a semiconductor structure includes a first substrate having thereon a first contact structure on a first pad and a second substrate comprising a second contact structure on a second pad. The first contact structure comprises a first metal base layer covered by a first nano-twinned metal coating layer. The second contact structure comprises a second metal base layer covered by a second nano-twinned metal coating layer. A solder layer is disposed between the first nano-twinned metal coating layer and the second nano-twinned metal coating layer.

According to some embodiments, the first metal base layer comprises a matrix of first metal patterns.

According to some embodiments, the second metal base layer comprises a matrix of second metal patterns.

According to some embodiments, the semiconductor structure further includes a $Cu_3Sn$ layer between the solder layer and the first nano-twinned metal coating layer and between the solder layer and the second nano-twinned metal coating layer.

According to some embodiments, the semiconductor structure further includes a $Cu_6Sn_5$ layer between the solder layer and the $Cu_3Sn$ layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 14:
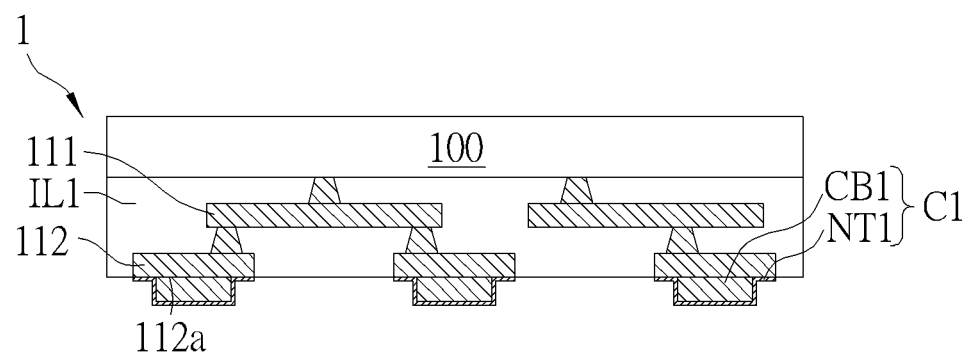
Figure 14:
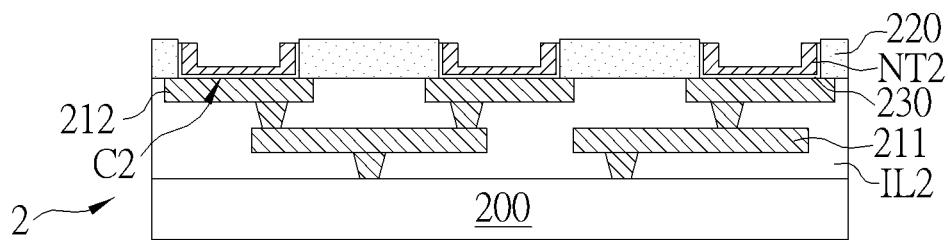
Figure 15:
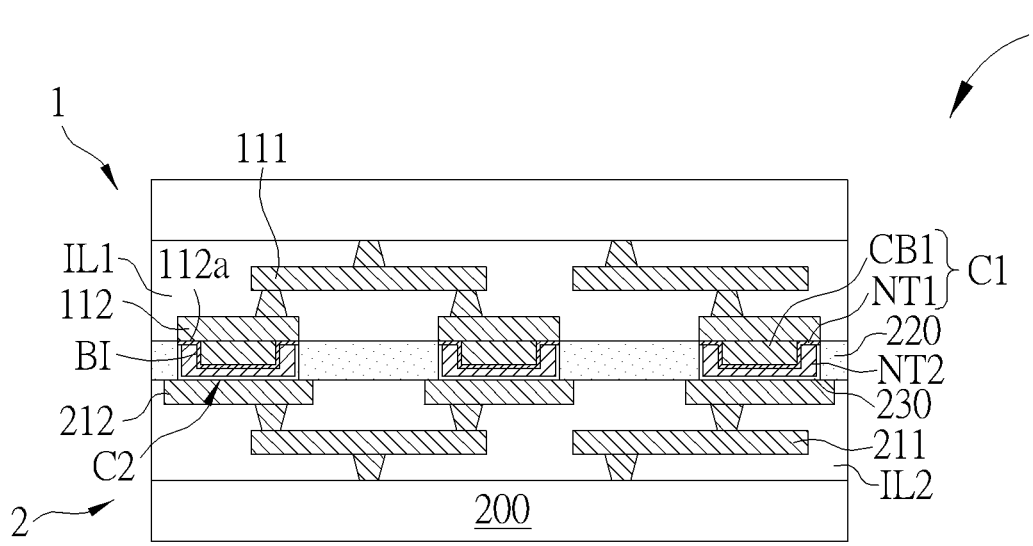

Please refer to FIG. 1 to FIG. 15, which are schematic diagrams showing a method for fabricating a semiconductor structure according to an embodiment of the present invention. FIG. 1 to FIG. 7 illustrate steps for processing a first substrate. FIG. 8 to FIG. 13 illustrate steps for processing a second substrate. FIG. 14 and FIG. 15 illustrate steps of bonding the first substrate and the second substrate.

Figure 1:
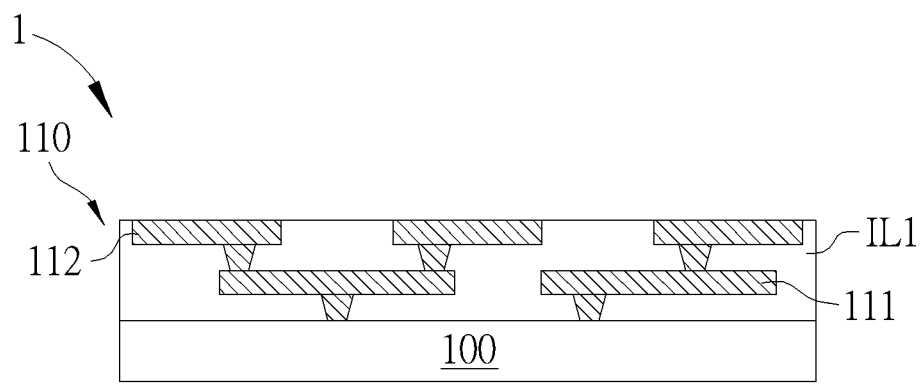
FIG. 1 to FIG. 15 are schematic diagrams showing a method of fabricating a semiconductor structure according to an embodiment of the present invention.

The steps for processing the first substrate will now be described. As shown in FIG. 1, the first substrate 1 may comprise a silicon substrate 100 and a redistribution layer 110 disposed on the silicon substrate 100. According to an embodiment of the present invention, the redistribution layer 110 may comprise a metal interconnect structure 111 formed in a dielectric layer ILL and a first pad 112 electrically connected to the metal interconnect structure 111. For the sake of simplicity, the circuit structures or elements formed on the silicon substrate 100 are not explicitly shown.

Figure 2:
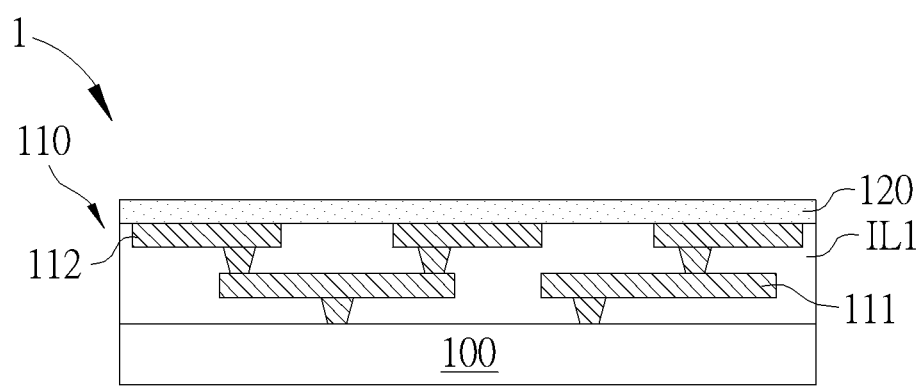

As shown in FIG. 2, a dielectric layer 120 is formed on the redistribution layer 110 to cover the first pad 112 and the dielectric layer IL1. According to an embodiment of the present invention, the dielectric layer 120 may comprise silicon oxide, silicon nitride, or polyimide, but is not limited thereto.

Figure 3:
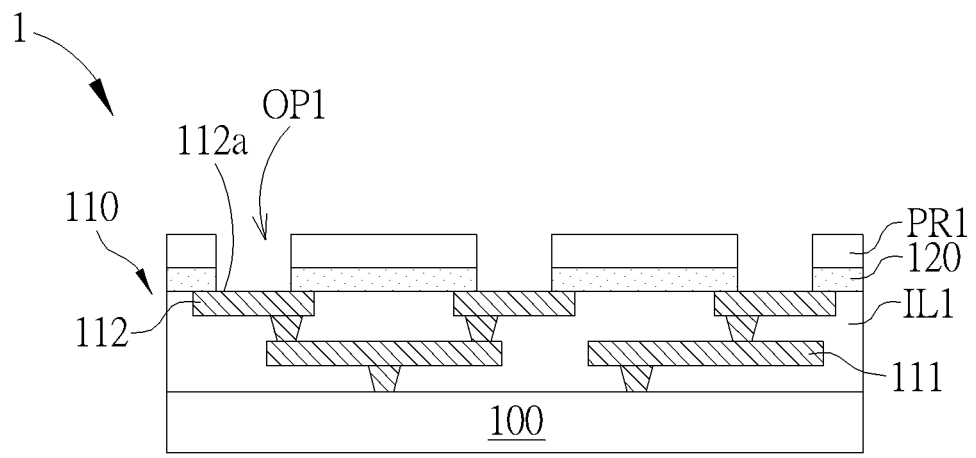

As shown in FIG. 3, a lithographic process is then performed to form a photoresist pattern PR1 on the dielectric layer 120, and then an etching process is performed to use the photoresist pattern PR1 as an etching resist mask to etch the dielectric layer 120 not covered by the photoresist pattern PR1, thereby forming an opening OP1. The opening OP1 is approximately aligned with the first pad 112 and reveals a portion of a top surface 112a of the first pad 112.

Figure 4:
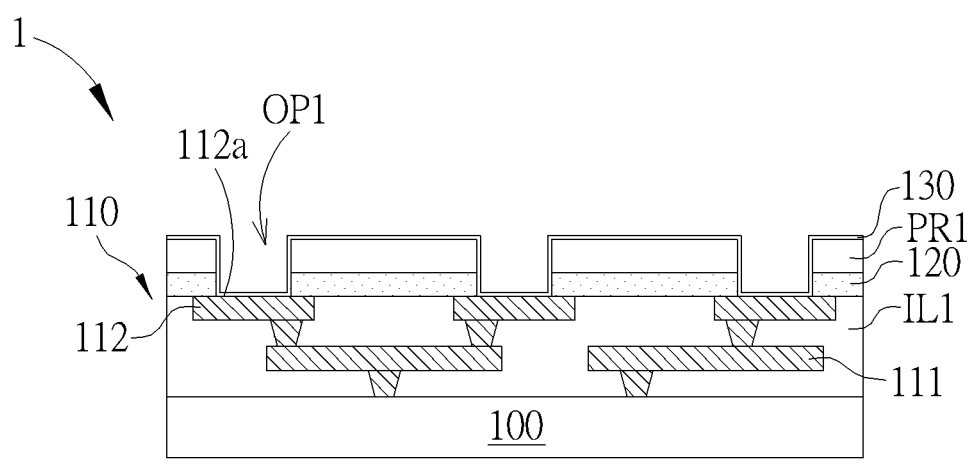

As shown in FIG. 4, a seed layer 130 may be formed to uniformly cover the photoresist pattern PR1 and an inner surface of and the opening OP1. According to an embodiment of the present invention, the seed layer 130 may comprise titanium or copper, but is not limited thereto.

Figure 5:
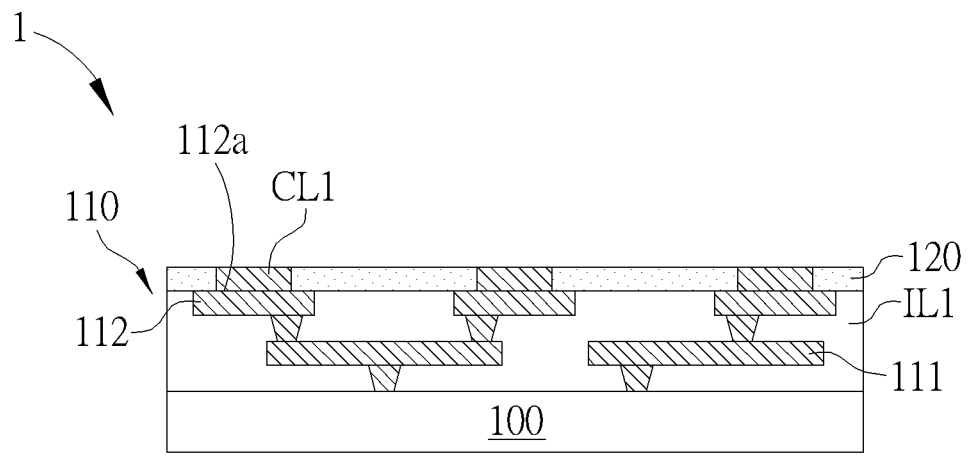

As shown in FIG. 5, the photoresist pattern PR1 is then stripped off, and a first metal layer CL1 is formed in the opening OP1 by electroplating. According to an embodiment of the present invention, the first metal layer CL1 may be a copper layer, but is not limited thereto.

Figure 6:
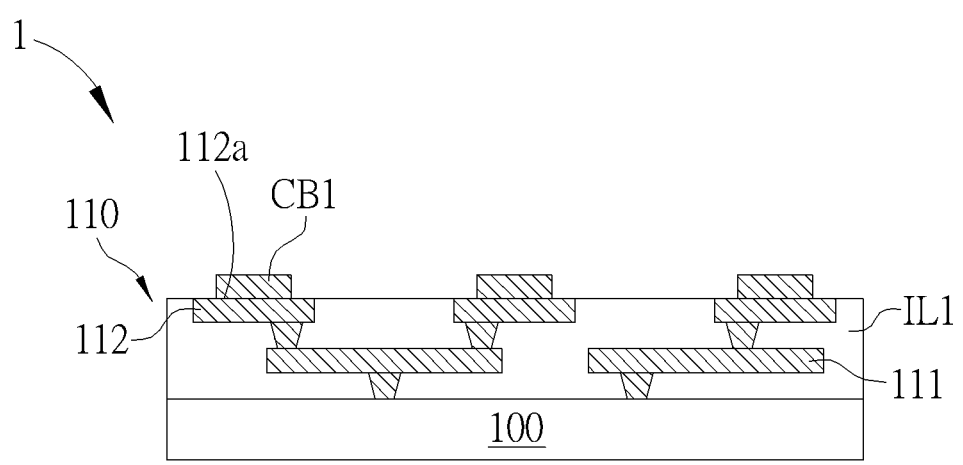

As shown in FIG. 6, after the dielectric layer 120 is removed, a first metal base layer CB1 is formed on the first pad 112. According to an embodiment of the present invention, the first metal base layer CB1 may be a copper metal base layer, but is not limited thereto. According to an embodiment of the present invention, the first metal base layer CB1 protrudes from the top surface 112a of the first pad 112.

Figure 7:
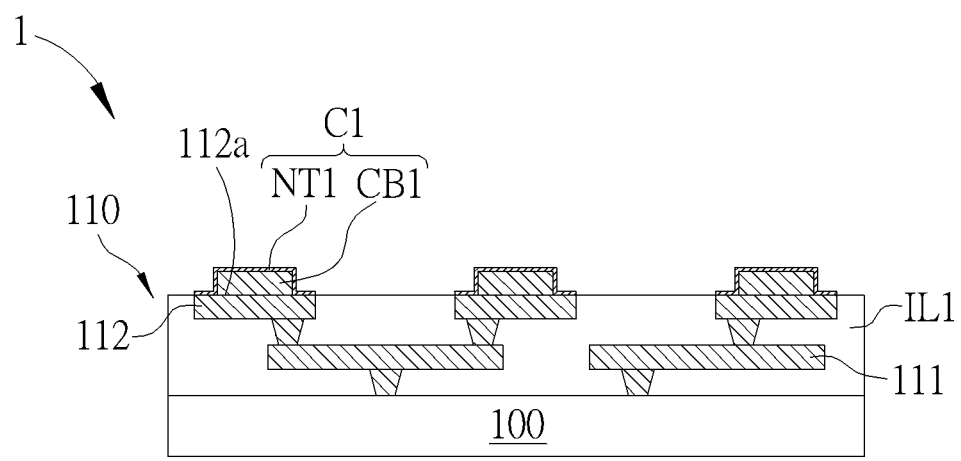

As shown in FIG. 7, an electroplating process is then performed to form a first nano-twinned metal coating layer NT1 on a surface of the first metal base layer CB1 and on the top surface 112a of the first pad 112 around the first metal base layer CB1. According to an embodiment of the present invention, the first nano-twinned metal coating layer NT1 is a first nano-twinned copper coating layer, for example, a (111)—oriented nano-twinned copper coating layer. According to an embodiment of the present invention, the first nano-twinned metal coating layer NT1 and the first metal base layer CB1 together constitute a first contact structure C1. According to an embodiment of the present invention, the first nano-twinned metal coating layer NT1 covers a top surface and sidewalls of the first metal base layer CB1, and extends to the top surface 112a of the first pad 112 around the first metal base layer CB1.

Figure 8:
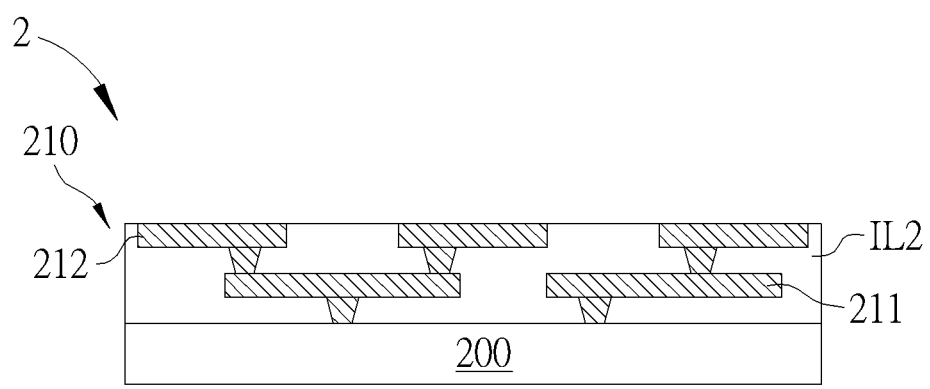

Next, the steps for processing the second substrate will be described with reference to FIG. 8 to FIG. 13. As shown in FIG. 8, similarly, the second substrate 2 may comprise a silicon substrate 200 and a redistribution layer 210 disposed on the silicon substrate 200. According to an embodiment of the present invention, the redistribution layer 210 may comprise a metal interconnect structure 211 formed in a dielectric layer IL2 and a second pad 212 electrically connected to the metal interconnect structure 211. For the sake of simplicity, the circuit structures or elements formed on the silicon substrate 200 are not shown.

Figure 9:
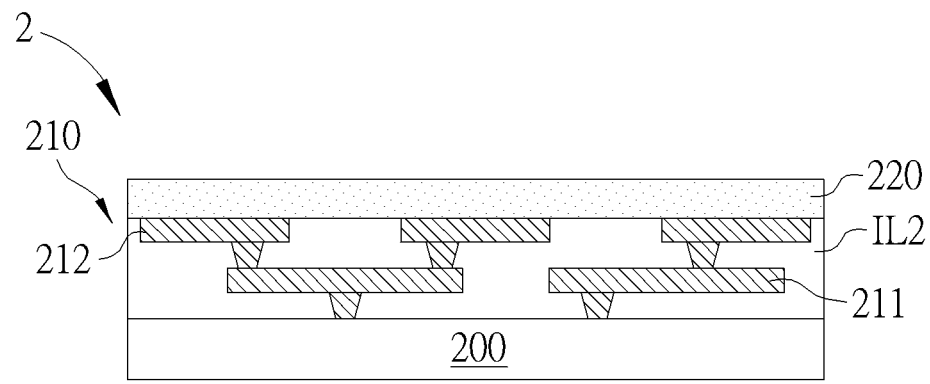

As shown in FIG. 9, similarly, a dielectric layer 220 is formed on the redistribution layer 210 to cover the second pad 212 and the dielectric layer IL2. According to an embodiment of the present invention, the dielectric layer 220 may comprise silicon oxide, silicon nitride, or polyimide, but is not limited thereto.

Figure 10:
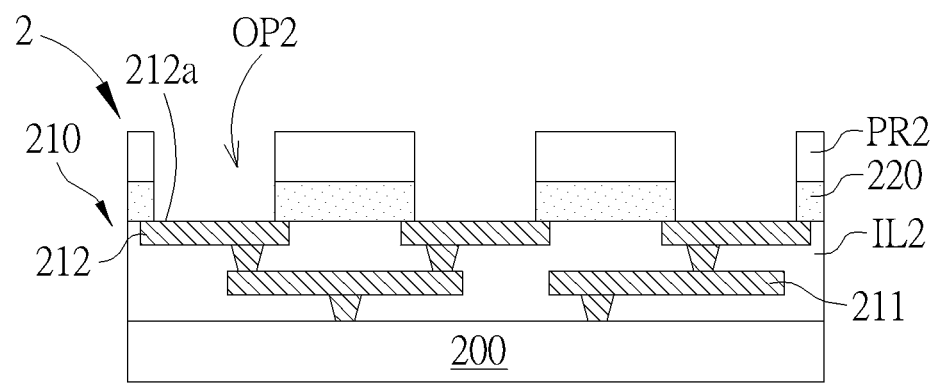

As shown in FIG. 10, a lithographic process is then performed to form a photoresist pattern PR2 on the dielectric layer 220, and then an etching process is performed to use the photoresist pattern PR2 as an etching resist mask to etch the dielectric layer 220 not covered by the photoresist pattern PR2, thereby forming an opening (or contact hole) OP2. The opening OP2 is approximately aligned with the second pad 212 and reveals a portion of a top surface 212a of the second pad 112.

Figure 11:
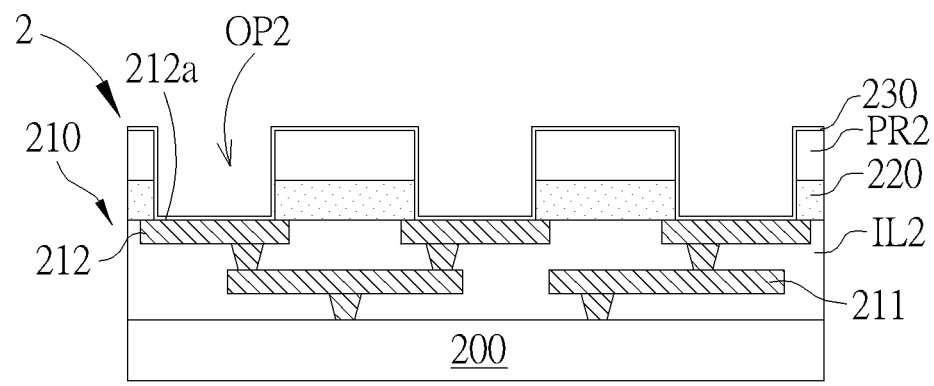

As shown in FIG. 11, a seed layer 230 is then formed to uniformly cover the photoresist pattern PR2 and an inner surface of the opening OP2. According to an embodiment of the present invention, the seed layer 230 may comprise titanium or copper, but is not limited thereto.

Figure 12:
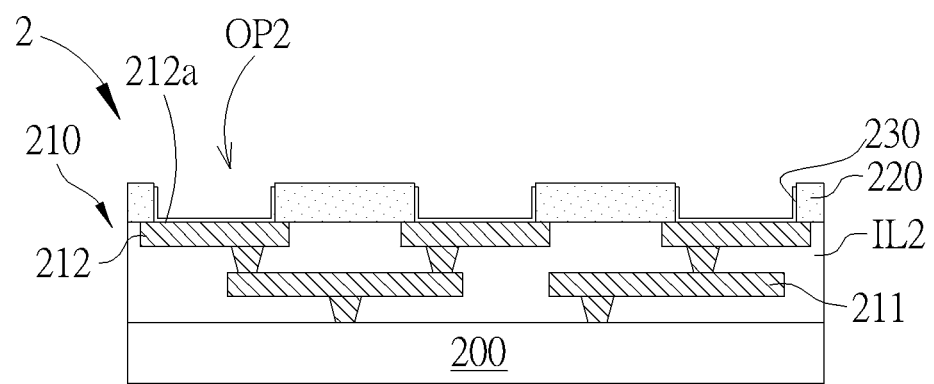

As shown in FIG. 12, the photoresist pattern PR2 is then peeled off, leaving a seed layer 230 in the opening OP2. The seed layer 230 covers the sidewall of the opening OP2 and the top surface 212a of the second pad 112.

Figure 13:
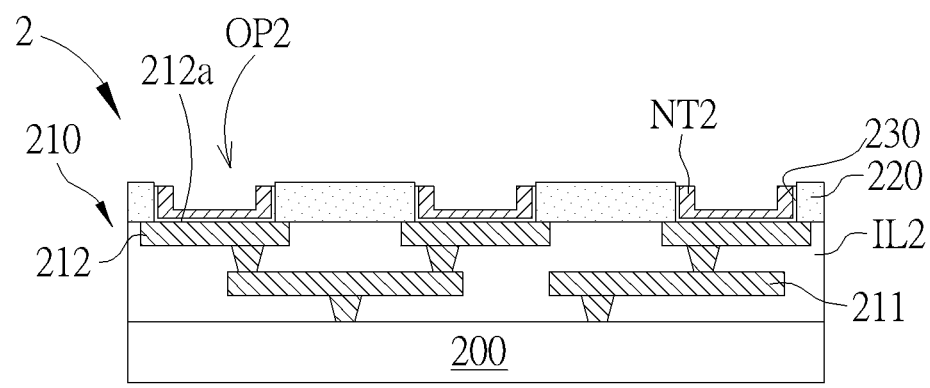

As shown in FIG. 13, an electroplating process is then performed to form a second nano-twinned metal coating layer NT2 on the seed layer 230. According to an embodiment of the present invention, the second nano-twinned metal coating layer NT2 is a second nano-twinned copper coating layer, for example, a (111)—oriented nano twinned copper coating layer. According to an embodiment of the present invention, the second nano-twinned metal coating layer NT2 formed in the opening OP2 constitutes a concave second contact structure C2.

Next, as shown in FIG. 14 and FIG. 15, the first substrate 1 is aligned with the second substrate 2, and the second substrate 2 is bonded to the first substrate 1 by engaging the first contact structure C1 with the second contact structure C2. A bonding interface BI is formed directly between the first nano-twinned metal coating layer NT1 and the second nano-twinned metal coating layer NT2. According to an embodiment of the present invention, the first contact structure C1 and the second contact structure C2 can be tightly bonded together, so that there is no gap between the first substrate 1 and the second substrate 2, thereby forming a semiconductor structure S1.

According to an embodiment of the present invention, to bond the second substrate 2 and the first substrate 1 together, a thermal compress bonding (thermal compress bonding) process may be used, for example, thermal pressing at 200-300 degrees Celsius for 30 seconds to 10 minutes.

According to an embodiment of the present invention, the first nano-twinned metal coating layer NT1 on the top surface 112a of the first pad 112 around the first metal base layer CB1 is in direct contact with the second nano-twinned metal coating layer NT2 on the sidewalls of the opening OP2.

Figure 16:
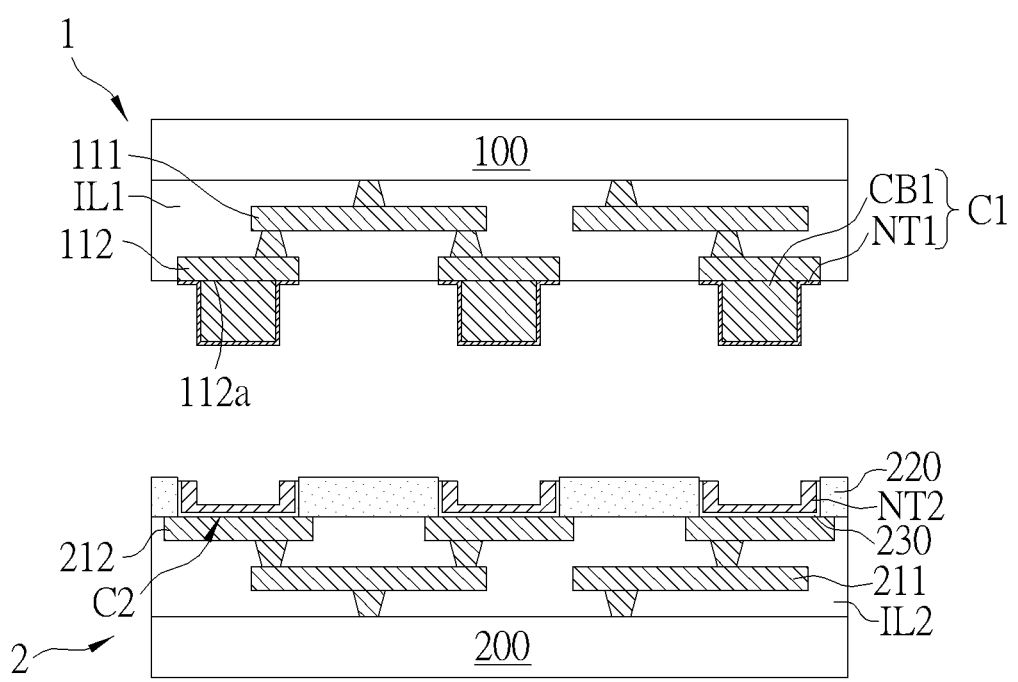
FIG. 16 to FIG. 19 illustrate another embodiment of the present invention.
Figure 17:
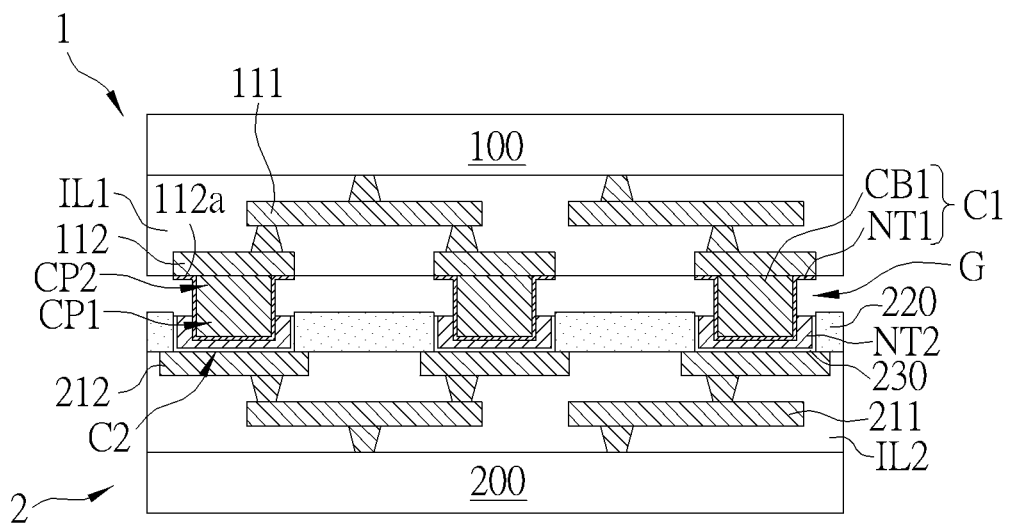

FIG. 16 to FIG. 19 illustrate another embodiment of the present invention, wherein like regions, layers or elements are designated by like numeral numbers or labels. According to another embodiment of the present invention, there may be a gap between the first substrate 1 and the second substrate 2. As shown in FIG. 16 and FIG. 17, the first contact structure C1 on the first substrate 1 is a pillar structure with a relatively greater height, and a similar concave second contact structure C2 is disposed the second substrate 2. The first substrate 1 is aligned with the second substrate 2, and the second substrate 2 and the first substrate 1 are bonded together by engaging the first contact structure C1 with the second contact structure C2. According to an embodiment of the present invention, the first contact structure C1 comprises a first part CP1 and a second part CP2, wherein only the first part CP1 is engaged with the second contact structure C2, so that a gap G is formed between the first substrate 1 and the second substrate 2.

Figure 18:
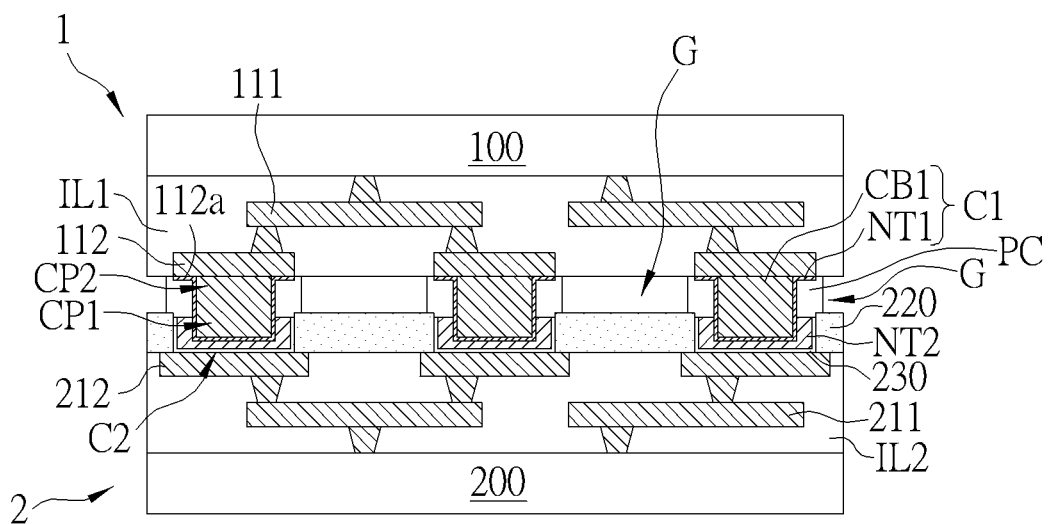
Figure 19:
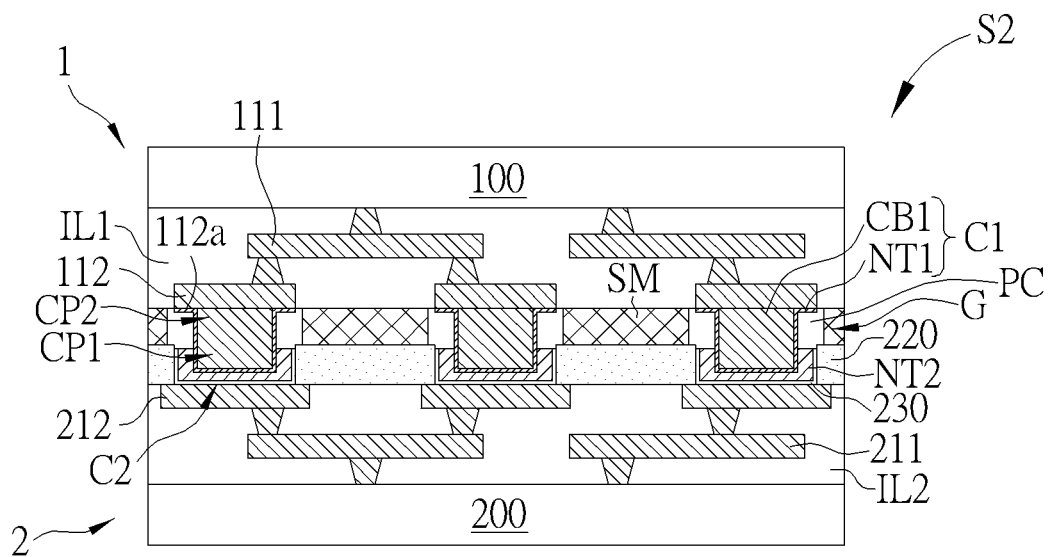

According to an embodiment of the present invention, as shown in FIG. 18, the surface of the second part CP2 of the first contact structure C1 may be surrounded by a bond enhancement layer PC. The bond enhancement layer PC can isolate moisture and air, and prevent the second part CP2 of the first contact structure C1 from being oxidized. According to an embodiment of the present invention, the bond enhancement layer PC may comprise Ni, Cu, Sn, Au, Ag, In, Pt or Co. According to an embodiment of the present invention, as shown in FIG. 19, the gap G may be further filled with a sealant SM, thus forming a semiconductor structure S2. For example, the sealant SM may comprise a polymer resin material, but is not limited thereto.

Figure 20:
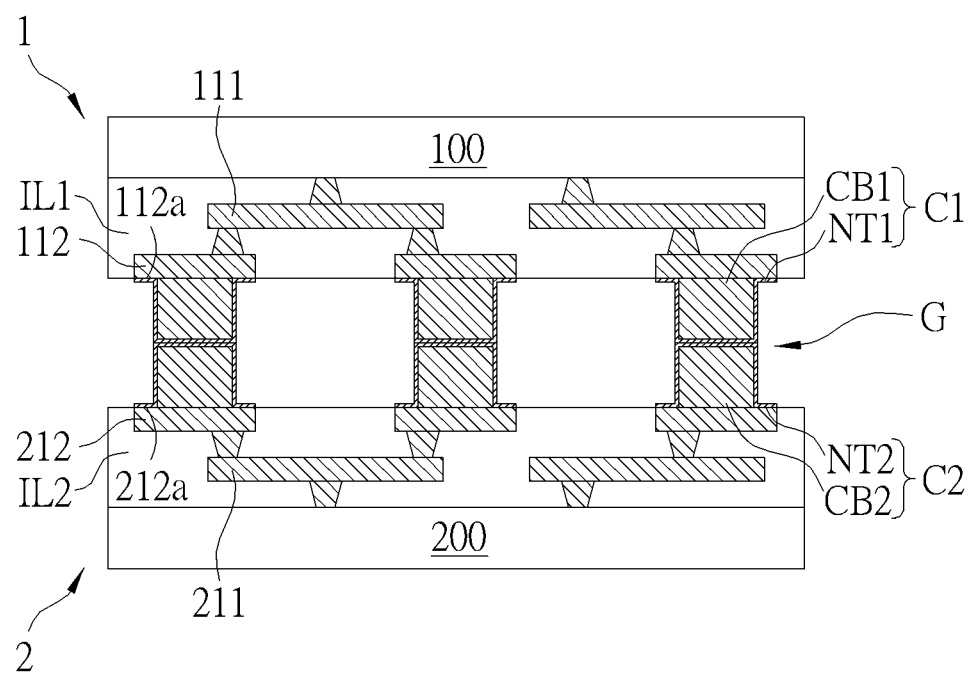
FIG. 20 to FIG. 22 illustrate another embodiment of the present invention.
Figure 21:
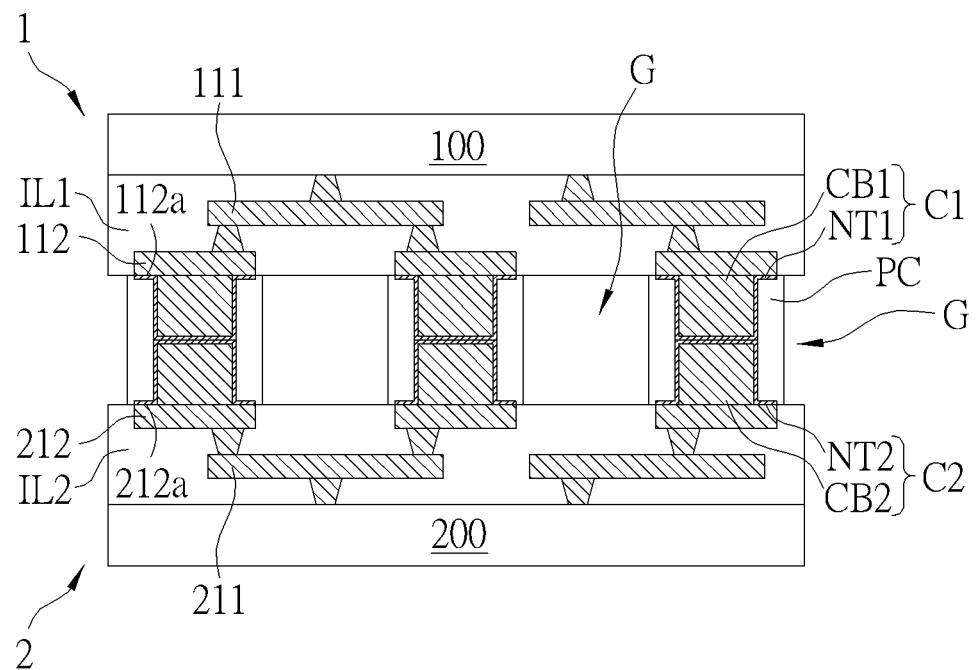
Figure 22:
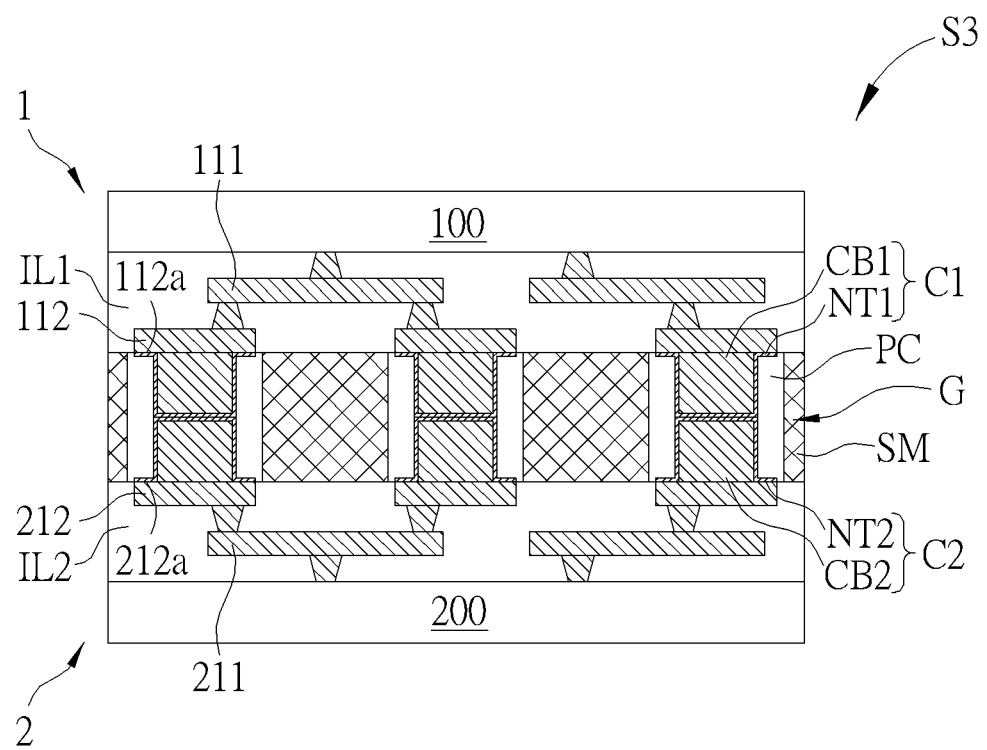

FIG. 20 to FIG. 22 illustrate another embodiment of the present invention, wherein identical regions, layers or elements are designated by identical numeral numbers or labels. As shown in FIG. 20, the first contact structure C1 on the first substrate 1 and the second contact structure C2 on the second substrate 2 are both pillar structures. According to an embodiment of the present invention, the second contact structure C2 comprises a second metal base layer CB2 covered by a second nano-twinned metal coating layer NT2. The second metal base layer CB2 protrudes from the top surface 212a of the second pad 212. The second nano-twinned metal coating layer NT2 covers a top surface and sidewalls of the second metal base layer CB2, and extends on the top surface 212a of the second pad 212 around the second metal base layer CB2. The first substrate 1 is then aligned with the second substrate 2, and the second substrate 2 and the first substrate 1 are bonded together by connecting the first contact structure C1 with the second contact structure C2. A gap G is formed between the first substrate 1 and the substrates 2.

According to an embodiment of the present invention, as shown in FIG. 21, the surfaces of the first contact structure C1 and the second contact structure C2 may be surrounded by the bond enhancement layer PC. The bond enhancement layer PC can isolate moisture and air, and prevent the first contact structure C1 and the second contact structure C2 from being oxidized. According to an embodiment of the present invention, the bond enhancement layer PC may comprise Ni, Cu, Sn, Au, Ag, In, Pt or Co. According to an embodiment of the present invention, as shown in FIG. 22, the gap G may be further filled with a sealant SM, thus forming a semiconductor structure S3. For example, the sealant SM may comprise a polymer resin material, but is not limited thereto.

Figure 23:
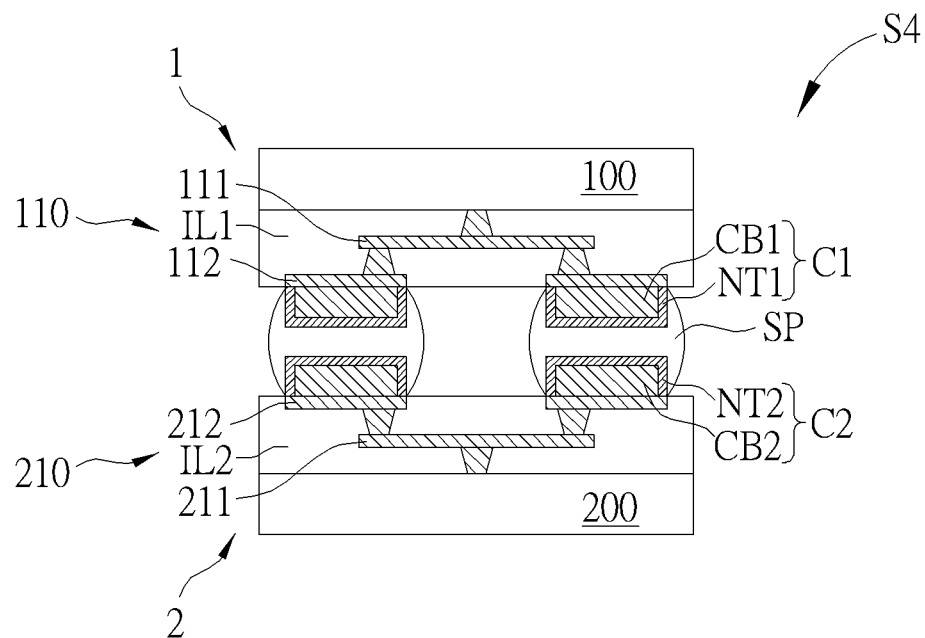
FIG. 23 to FIG. 24 illustrate still another embodiment of the present invention.
Figure 24:
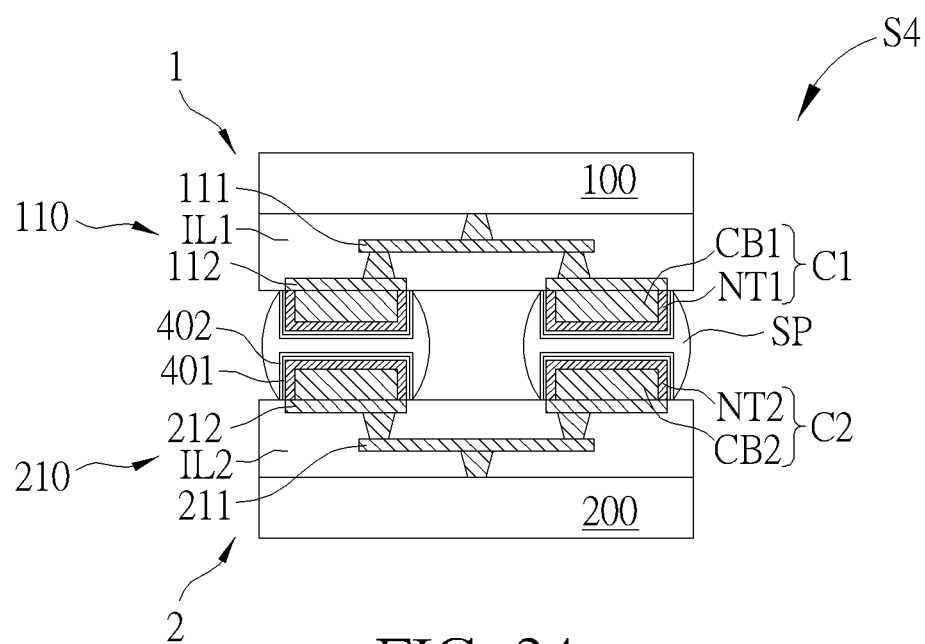

FIG. 23 to FIG. 24 illustrate still another embodiment of the present invention, wherein like regions, layers or elements are designated by like numeral numbers or labels. As shown in FIG. 23, the first contact structure C1 on the first substrate 1 and the second contact structure C2 on the second substrate 2 are bump or pillar structures. The first substrate 1 is aligned with the second substrate 2, and a solder layer SP is applied between the first contact structure C1 and the second contact structure C2. For example, the solder layer SP may contain tin. A thermal compression bonding is performed to connect the first contact structure C1 and the second contact structure C2 through the solder layer SP to bond the second substrate 2 and the first substrate 1 together, thus forming a semiconductor structure S4.

The semiconductor structure S4 comprises the first substrate 1 and the second substrate 2. The first substrate 1 comprises the first contact structure C1 on the first pad 112. The first contact structure C1 comprises the first metal base layer CB1 covered by the first nano-twinned metal coating layer NT1. The second substrate 2 comprises the second contact structure C2 on the second pad 212, wherein the second contact structure C2 comprises the second metal base layer CB2 covered by the second nano-twinned metal coating layer NT2. The solder layer SP is disposed between the first nano-twinned metal coating layer NT1 and the second nano-twinned metal coating layer NT2.

As shown in FIG. 24, after the thermal compression bonding is completed, a $Cu_3Sn$ layer 401 is formed between the solder layer SP and the first nano-twinned metal coating layer NT1 and between the solder layer SP and the second nano-twinned metal coating layer NT2. In addition, a $Cu_6Sn_5$ layer 402 is formed between the solder layer SP and the $Cu_3Sn$ layer 401.

Figure 25:
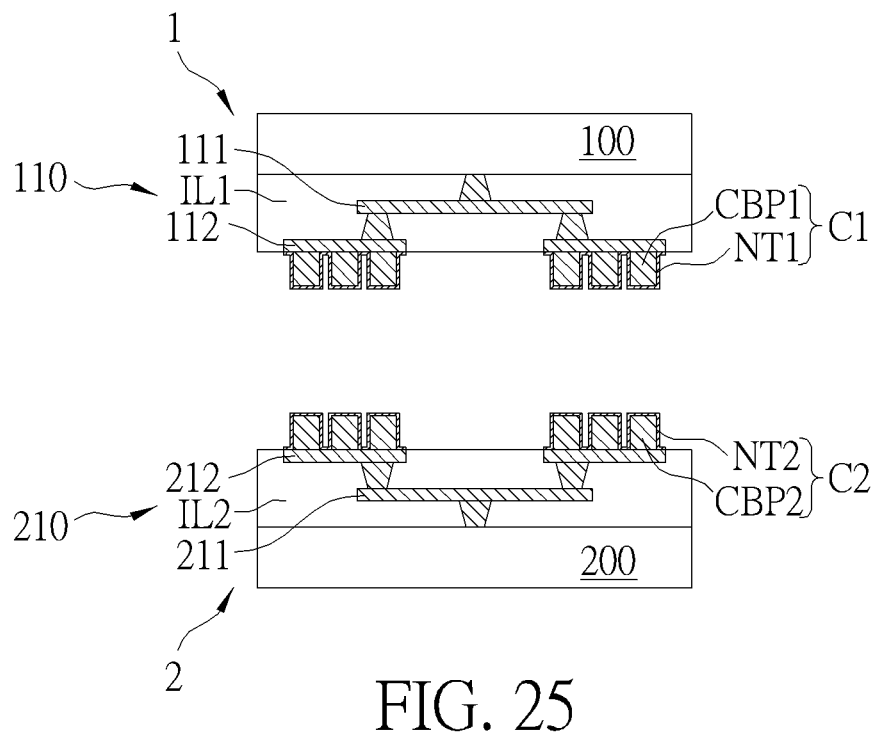
FIG. 25 to FIG. 27 illustrate yet another embodiment of the present invention.
Figure 26:
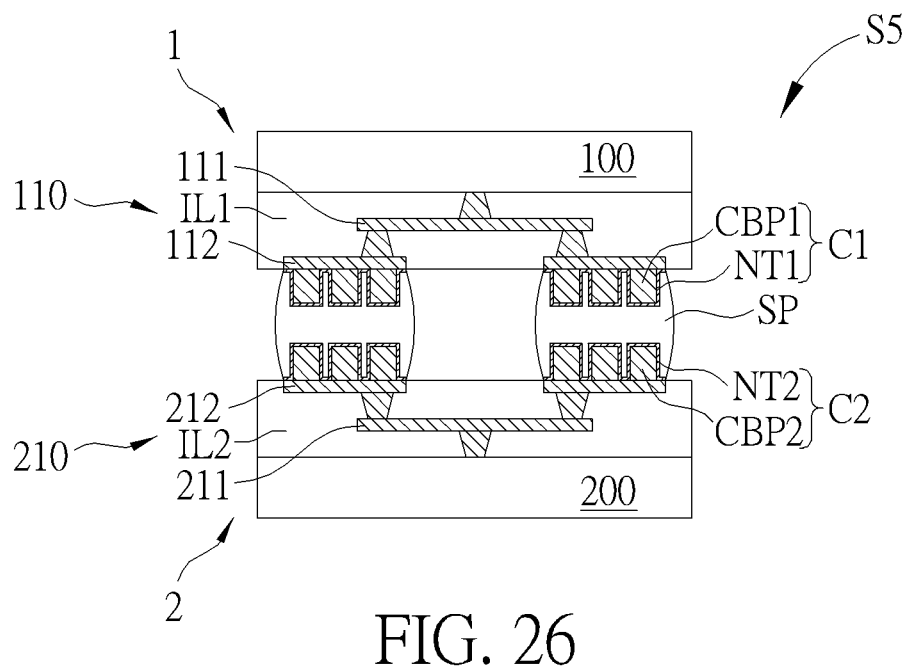
Figure 27:
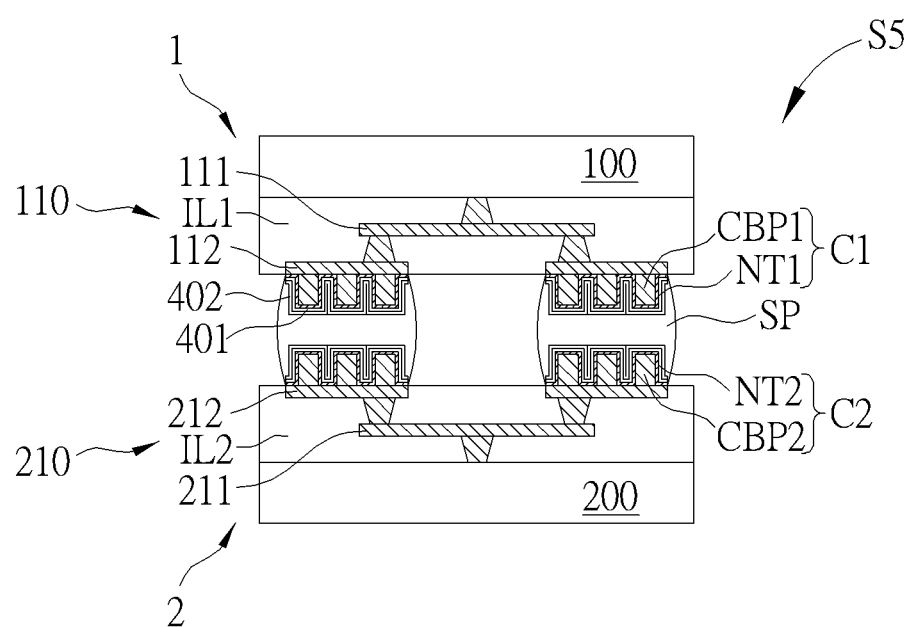

FIG. 25 to FIG. 27 illustrate yet another embodiment of the present invention, wherein identical regions, layers or elements are designated by identical numeral numbers or labels. The first contact structure C1 on the first substrate 1 and the second contact structure C2 on the second substrate 2 may be composed of a plurality of bump or pillar structures arranged in a matrix. As shown in FIG. 25, the first substrate 1 comprises a first contact structure C1 located on the first pad 112. The first contact structure C1 comprises a plurality of first metal patterns CBP1 arranged in a matrix covered by the first nano-twinned metal coating layer NT1. The second substrate 2 comprises a second contact structure C2 located on the second pad 212. The second contact structure C2 comprises a plurality of second metal patterns CBP2 arranged in a matrix covered by a second nano-twinned metal coating layer NT2.

As shown in FIG. 26, the first substrate 1 is aligned with the second substrate 2, and a solder layer SP is applied between the first contact structure C1 and the second contact structure C2. For example, the solder layer SP contains tin. A thermal compression bonding process is performed to connect the first contact structure C1 and the second contact structure C2 through the solder layer SP to bond the second substrate 2 and the first substrate 1 together, thereby forming a semiconductor structure S5.

As shown in FIG. 27, after the thermal compression bonding process is completed, a $Cu_3Sn$ layer 401 is formed between the solder layer SP and the first nano-twinned metal coating layer NT1 and between the solder layer SP and the second nano-twinned metal coating layer NT2. In addition, a $Cu_6Sn_5$ layer 402 is formed between the solder layer SP and the $Cu_3Sn$ layer 401.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A semiconductor structure, comprising:
   a first substrate having thereon a first contact structure on a first pad, wherein the first contact structure comprises a first metal base layer covered by a first nano-twinned metal coating layer, wherein the first metal base layer protrudes from a top surface of the first pad, and wherein the first nano-twinned metal coating layer covers a top surface and a sidewall of the first metal base layer and extends to the top surface of the first pad around the first metal base layer; and
   a second substrate comprising a second contact structure on a second pad, wherein the second contact structure comprises a second nano-twinned metal coating layer on the second pad, wherein the first contact structure is connected with the second contact structure, thereby constituting a bonding interface directly between the first nano-twinned metal coating layer and the second nano-twinned metal coating layer.

2. The semiconductor structure according to claim 1, wherein the second contact structure comprises a contact hole in a dielectric layer and wherein the second nano-twinned metal coating layer is coated on a sidewall of the contact hole and on a top surface of the second pad.

3. The semiconductor structure according to claim 2, wherein the first nano-twinned metal coating layer on the top surface of the first pad around the first metal base layer is in direct contact with the second nano-twinned metal coating layer on the sidewall of the contact hole.

4. The semiconductor structure according to claim 2, wherein the first contact structure comprises a first portion and a second portion, wherein only the first portion is connected with the second contact structure, thereby forming a gap between the first substrate and the second substrate.

5. The semiconductor structure according to claim 4, wherein the second portion is surrounded by a bond enhancement layer.

6. The semiconductor structure according to claim 5, wherein the bond enhancement layer comprises Ni, Cu, Sn, Au, Ag, In, Pt or Co.

7. The semiconductor structure according to claim 4, wherein the gap is filled with a sealant.

8. The semiconductor structure according to claim 1, wherein the first nano-twinned metal coating layer is a first nano-twinned copper coating layer, and the second nano-twinned metal coating layer is a second nano-twinned copper coating layer.

9. The semiconductor structure according to claim 8, wherein the first nano-twinned copper coating layer and the second nano-twinned copper coating layer are (111)—oriented nano-twinned copper coating layers.

10. The semiconductor structure according to claim 1, wherein the second contact structure comprises a second metal base layer covered by the second nano-twinned metal coating layer.

11. The semiconductor structure according to claim 10, wherein the second metal base layer protrudes from a top surface of the second pad, and wherein the second nano-twinned metal coating layer covers a top surface and a sidewall of the second metal base layer and extends to the top surface of the second pad around the second metal base layer.

12. The semiconductor structure according to claim 11, wherein the first contact structure and the second contact structure are surrounded by a bond enhancement layer.

13. The semiconductor structure according to claim 12, wherein the bond enhancement layer comprises Ni, Cu, Sn, Au, Ag, In, Pt or Co.

14. The semiconductor structure according to claim 12, wherein a gap between the first substrate and the second substrate is filled with a sealant.

15. A method for forming a semiconductor structure, comprising:
    providing a first substrate having thereon a first contact structure on a first pad, wherein the first contact structure comprises a first metal base layer covered by a first nano-twinned metal coating layer, wherein the first metal base layer protrudes from a top surface of the first pad, and wherein the first nano-twinned metal coating layer covers a top surface and a sidewall of the first metal base layer and extends to the top surface of the first pad around the first metal base layer;
    providing a second substrate comprising a second contact structure on a second pad, wherein the second contact structure comprises a second nano-twinned metal coating layer on the second pad; and
    bonding the second substrate to the first substrate by engaging the first contact structure with the second contact structure, thereby constituting a bonding interface directly between the first nano-twinned metal coating layer and the second nano-twinned metal coating layer.

16. A semiconductor structure, comprising:
    a first substrate having thereon a first contact structure on a first pad, wherein the first contact structure comprises a first metal base layer, wherein a top surface and a sidewall of the first metal base layer are covered by a first nano-twinned metal coating layer;

a second substrate comprising a second contact structure on a second pad, wherein the second contact structure comprises a second metal base layer, wherein a top surface and a sidewall of the second metal base layer are covered by a second nano-twinned metal coating layer; and a solder layer between the first nano-twinned metal coating layer and the second nano-twinned metal coating layer.

17. The semiconductor structure according to claim 16, wherein the first metal base layer comprises a matrix of first metal patterns.

18. The semiconductor structure according to claim 17, wherein the second metal base layer comprises a matrix of second metal patterns.

19. The semiconductor structure according to claim 16 further comprising:

a $Cu_3Sn$ layer between the solder layer and the first nano-twinned metal coating layer and between the solder layer and the second nano-twinned metal coating layer.

20. The semiconductor structure according to claim 19 further comprising:

a $Cu_6Sn_5$ layer between the solder layer and the $Cu_3Sn$ layer.

* * * * *